(12) United States Patent
Zhang et al.

(10) Patent No.: US 11,515,275 B2
(45) Date of Patent: Nov. 29, 2022

(54) COPPER WIRE BOND ON GOLD BUMP ON SEMICONDUCTOR DIE BOND PAD

(71) Applicant: TEXAS INSTRUMENTS INCORPORATED, Dallas, TX (US)

(72) Inventors: Lin Zhang, Chengdu (CN); Huo Yun Duan, Chengdu (CN); Xi Lin Li, Chengdu (CN); Chen Xiong, Chengdu (CN); Xiao Lin Kang, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/941,701

(22) Filed: Jul. 29, 2020

(65) Prior Publication Data
US 2021/0313291 A1 Oct. 7, 2021

Related U.S. Application Data

(63) Continuation of application No. PCT/CN2020/074433, filed on Apr. 6, 2020.

(51) Int. Cl.
*H01L 23/498* (2006.01)
*H01L 23/00* (2006.01)

(52) U.S. Cl.
CPC ........ *H01L 24/14* (2013.01); *H01L 23/49816* (2013.01); *H01L 23/49861* (2013.01);
(Continued)

(58) Field of Classification Search
CPC ......... H01L 24/05; H01L 24/11; H01L 24/14; H01L 24/32; H01L 24/43; H01L 24/45; H01L 24/46; H01L 24/48; H01L 24/73; H01L 24/78; H01L 24/81; H01L 24/85; H01L 23/00; H01L 23/31; H01L 23/495; H01L 23/498; H01L 23/4952;
(Continued)

(56) References Cited

U.S. PATENT DOCUMENTS 7,205,673 B1 4/2007 Pllinti et al.
7,404,513 B2 7/2008 Kadoguchi et al.
(Continued)

FOREIGN PATENT DOCUMENTS

CN 103811446 5/2014

OTHER PUBLICATIONS

Goh et al., Corrosion Study and Intermetallics Formation in Gold and Copper Wire Bonding in Microelectronics Packaging, Crystals 2013, vol. 3, Jul. 2013, pp. 392-404, MDPI, Basel, Switzerland.
(Continued)

*Primary Examiner* — Chuong A Luu
(74) *Attorney, Agent, or Firm* — Ronald O. Neerings; Charles A. Brill; Frank D. Cimino (57) ABSTRACT

A semiconductor package includes a conductive pad, a semiconductor die with an aluminum bond pad over a dielectric layer of the semiconductor die, a gold bump on the aluminum bond pad, a first intermetallic layer of gold and aluminum between the aluminum bond pad and the gold bump, a copper ball bond on the gold bump, a second intermetallic layer of copper and gold between the copper ball bond and the gold bump, a copper wire extending from the copper ball bond to the conductive pad, a stitch bond between the copper wire and the conductive pad.

29 Claims, 7 Drawing Sheets

(52) U.S. Cl.
CPC ............. *H01L 24/05* (2013.01); *H01L 24/11* (2013.01); *H01L 24/43* (2013.01); *H01L 24/46* (2013.01); *H01L 24/73* (2013.01); *H01L 24/81* (2013.01); *H01L 2224/05124* (2013.01); *H01L 2224/141* (2013.01); *H01L 2224/14505* (2013.01); *H01L 2224/45147* (2013.01); *H01L 2224/73207* (2013.01); *H01L 2224/81205* (2013.01); *H01L 2924/01013* (2013.01); *H01L 2924/01029* (2013.01); *H01L 2924/01079* (2013.01)

(58) Field of Classification Search
CPC ......... H01L 23/49816; H01L 23/49861; H01L 23/3107; H01L 2224/141; H01L 2224/8085; H01L 2224/8185; H01L 2224/05124; H01L 2224/14505; H01L 2224/45147; H01L 2224/73207; H01L 2224/81205; H01L 2224/05554; H01L 2224/05624; H01L 2224/45144; H01L 2224/32245; H01L 2224/48247; H01L 2224/48465; H01L 2224/48482; H01L 2224/48499; H01L 2224/73265; H01L 2224/85051; H01L 2224/85181; H01L 2224/85205; H01L 2224/85207; H01L 2924/181; H01L 2924/10161; H01L 2924/01079; H01L 2924/01029; H01L 2924/01013

USPC ....................................................... 438/613
See application file for complete search history.

(56) References Cited

U.S. PATENT DOCUMENTS

| | | | |
|---|---|---|---|
| 7,939,939 | B1 | 5/2011 | Zeng et al. |
| 8,225,982 | B2 | 7/2012 | Pirkle et al. |
| 8,258,616 | B1 | 9/2012 | Liou |
| 8,298,947 | B2 | 10/2012 | Masumoto |
| 9,627,299 | B1 | 4/2017 | Flessner |
| 10,566,279 | B2 * | 2/2020 | Lu ................. H01L 21/6835 |
| 11,211,320 | B2 * | 12/2021 | Milo ................ H01L 23/49861 |
| 2008/0179745 | A1 | 7/2008 | Hess et al. |
| 2011/0192885 | A1 | 11/2011 | Hochstenbach et al. |
| 2012/0001336 | A1 | 1/2012 | Zeng et al. |
| 2013/0175677 | A1 | 7/2013 | Chang et al. |
| 2017/0229419 | A1 | 8/2017 | Hashim et al. |
| 2017/0256510 | A1 | 9/2017 | Miyawki et al. |
| 2020/0203243 | A1 * | 6/2020 | Koduri ............ H01L 23/49582 |
| 2022/0005781 | A1 * | 1/2022 | Amano ................ H01L 21/768 |

OTHER PUBLICATIONS

Chaudhry et al., TI's journey to high-volume copper wire bonding production, Texas Instruments, Oct. 2014, Dallas, Texas.

* cited by examiner

COPPER WIRE BOND ON GOLD BUMP ON SEMICONDUCTOR DIE BOND PAD

TECHNICAL FIELD

This disclosure relates to semiconductor packages.

BACKGROUND

Semiconductor devices including active and/or passive components may be manufactured into round wafers sliced from elongated cylinder-shaped single crystals of semiconductor elements or compounds. The diameter of these solid-state wafers may reach up to 12 inches or more. Individual semiconductor dies are typically singulated from a round wafer by sawing streets in X- and Y-directions through the wafer in order to create rectangularly shaped discrete pieces from the wafers.

Each semiconductor die includes at least one active or passive component and bond pads serving to facilitate electric connections to the component(s) of the semiconductor die. A bond pad may be a build-up layer of metal, such as aluminum or thick copper with nickel palladium plating, over a metallization layer of a semiconductor die. Semiconductor dies include many large families of functional circuits; examples include active devices such as diodes and transistors like field-effect transistors, passive devices such as resistors and capacitors, and integrated circuits, which can include far more than a million active and passive components.

After singulation, one or more semiconductor dies are attached to a discrete supporting substrate such as a metal leadframe or a rigid multi-level substrate laminated from a plurality of metallic and insulating layers. The conductive traces of the leadframes and substrates are connected to the bonds pads, typically using wire bonds or metal bumps such as solder bumps.

Leadframes may include a pad and one or more leads. The pad serves as a substrate providing a stable support for firmly positioning a semiconductor die within the semiconductor package during manufacturing, whereas the leads provide electrical connections from outside the package to the active surface of the semiconductor die. Gaps between the inner end of the leads and contact pads on the active surface of the semiconductor die are bridged by connectors, typically wire bonds—thin metal wires, such as gold or copper wires, individually bonded to both the bond pads and the leads.

The assembled semiconductor dies, leadframes and/or substrates may be encapsulated to form discrete robust packages, which frequently employ hardened polymeric compounds and are formed by techniques such as transfer molding. The assembly and packaging processes are performed either on an individual basis or as part of batch processes including a strip or array of semiconductor dies on a corresponding strip or array of leadframes. In batch processes, mold compound may be applied to all packages of leadframe strip through a single loading of a mold press.

BRIEF SUMMARY

Copper wire bonds provide advantages in cost and performance over gold wire bonds. For example, copper has higher electrical and thermal conductivity compared to gold. However, copper also has a higher hardness and brittleness compared to gold, and manufacturing techniques for copper wire bonds can damage bond pads and underlying circuitry of a semiconductor die in some applications. For this reason, gold bond wires remain preferable in applications where copper wire bonding techniques may cause damage to the semiconductor die or where copper wire bonds may crack.

As disclosed herein, a semiconductor package includes a semiconductor die with a bond pad, a gold bump on the bond pad and a copper wire bond extending from the gold bump. For example, the copper wire bond may extend from the gold bump to a package lead.

Also disclosed are methods for forming such gold bumps and copper wire bonds. The gold bump may be applied with a lower bond energy than the copper wire bond. During the higher-energy application of the copper wire bond, the gold bump protects the bond pad, mitigating damage to the semiconductor die bond pad and underlying circuitry. Methods for forming the copper wire bond may include limited or no ultrasound current, which may limit growth of intermetallics between the bond pad and gold bump while forming the copper wire bond compared to alternative techniques utilizing higher levels of ultrasound current for forming the copper wire bond.

In one example, a semiconductor package includes a conductive pad, a semiconductor die with an aluminum bond pad over a dielectric layer of the semiconductor die, a gold bump on the aluminum bond pad, a first intermetallic layer of gold and aluminum between the aluminum bond pad and the gold bump, a copper ball bond on the gold bump, a second intermetallic layer of copper and gold between the copper ball bond and the gold bump, a copper wire extending from the copper ball bond to the conductive pad, a stitch bond between the copper wire and the conductive pad.

In another example, a method for fabricating a semiconductor package includes forming a first free air ball of a gold wire at a first tip of a first capillary, attaching, with the first capillary, the first free air ball to a metallic bond pad of a semiconductor die to form a gold bump attached to the metallic bond pad with a first bond force with a first ultrasound current applied during a first bond time at a first temperature, the metallic bond pad being over a dielectric layer of the semiconductor die, separating the first ball from the gold wire, forming a second free air ball of a copper wire at a second tip of a second capillary, and attaching, with the second capillary, the second free air ball to the gold bump with a second bond force applied during a second bond time at a second temperature to form a ball bond. The second temperature is greater than the first temperature, the second bond force is greater than the first bond force, and the second bond time is less than the first bond time. The method further includes spanning the copper wire in a controlled loop to a conductive pad, pressuring the copper wire to form a stitch bond between the copper wire and the conductive pad, and breaking the copper wire.

In another example, a method for fabricating a semiconductor package includes forming a first free air ball of a gold wire at a first tip of a first capillary, attaching, with the first capillary, the first free air ball to an aluminum bond pad of a semiconductor die to form a gold bump attached to the aluminum bond pad with a first bond force within a range of 20 to 40 grams (g) with a first ultrasound current range of 50 to 70 milliamps (mA) applied during a first bond time of between 15 and 30 milliseconds (mS) at a first temperature range of 160 to 200 degrees Celsius (° C.), the aluminum bond pad being over a dielectric layer of the semiconductor die, separating the gold bump from the gold wire, forming a second free air ball of a copper wire at a second tip of a second capillary, attaching, with the second capillary, the second free air ball to the gold bump to form a ball bond with a second bond force within a range of 60 to 100 g with a second ultrasound current range of 0 to 10 mA applied during a second bond time of between 8 and 15 mS at a second temperature range of 225 to 275° C., spanning the copper wire in a controlled loop to a conductive pad, pressuring the copper wire to form a stitch bond between the copper wire and the conductive pad, and breaking the copper wire.

DETAILED DESCRIPTION

As disclosed herein, a semiconductor package includes a semiconductor die with a bond pad, a gold bump on the bond pad, and a copper wire bond extending from the gold bump to a conductive pad, such as a stich bonding area of lead. The gold bump may be applied with a lower bond energy than the copper wire bond. During the higher-energy application of the copper wire bond, the gold bump protects the bond pad, mitigating damage to the semiconductor die bond pad and underlying dielectric layers and functional circuity. The disclosed techniques may be utilized in applications where copper wire bonds connected directly to bond pads are not suitable, and provide advantages over gold wire bonds, such as reduced cost, and higher electrical and thermal conductivity. One such example, semiconductor package 100, is illustrated in FIG. 1.

Figure 1:
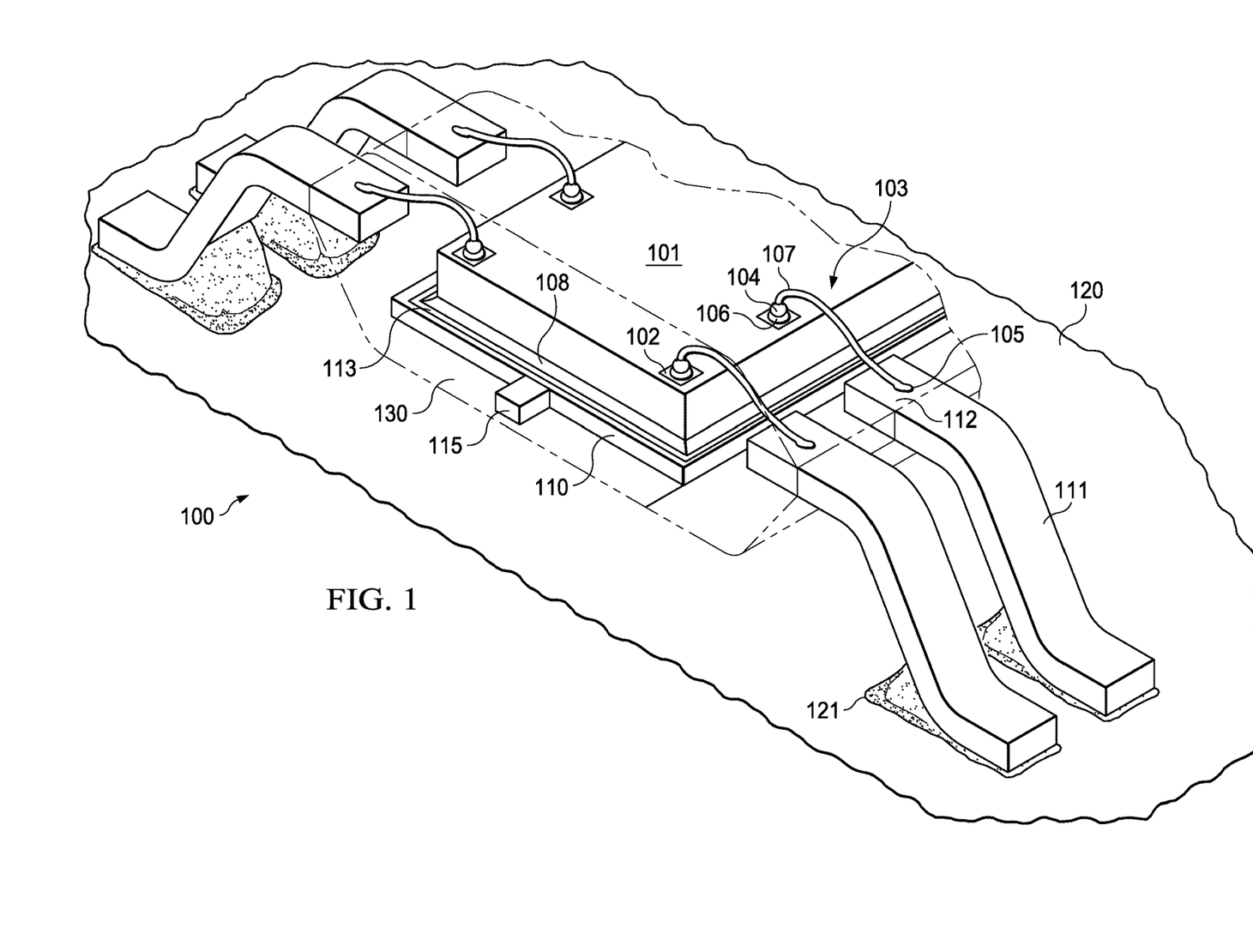
FIG. 1 is a perspective hidden view of a portion of a semiconductor package including gold bumps on bond pads of a semiconductor die and copper wire bonds extending from the gold bumps.

FIG. 1 is a perspective hidden view of a portion of semiconductor package 100 assembled by solder 121 on a board 120, such as a printed circuit board (PCB). Semiconductor package 100 includes a semiconductor die 101 bonded with a die attach adhesive 113 onto a metallic pad 110 of a metallic leadframe 108. Semiconductor package 100 further includes a mold compound 130 covering pad 110, semiconductor die 101, metallic bond pad 102, gold bump 106, ball bond 104, copper wire 107, stitch bond 105 and end portion 112 of each lead 111. Exposed portions of leads 111 of leadframe 108 enable the solder attachment to board 120.

As shown in FIG. 1, bond pads 102 of semiconductor die 101 are electrically connected by wire bonds 103 to respective leads 111. In accordance with the techniques of this disclosure, a gold bump 106 is on each bond pad 102. Each of wire bonds 103 include a ball bond 104 on one end of a wire 107 to connect to a respective gold bump 106 and a stitch bond 105 on the other end of the wire 107 to connect to a respective lead 111. Copper wires 107 of wire bonds 103, are made of electrically conductive copper or copper alloys. In some examples, wires 107 may have diameters between about 10 to 25 μm.

Figure 2A:
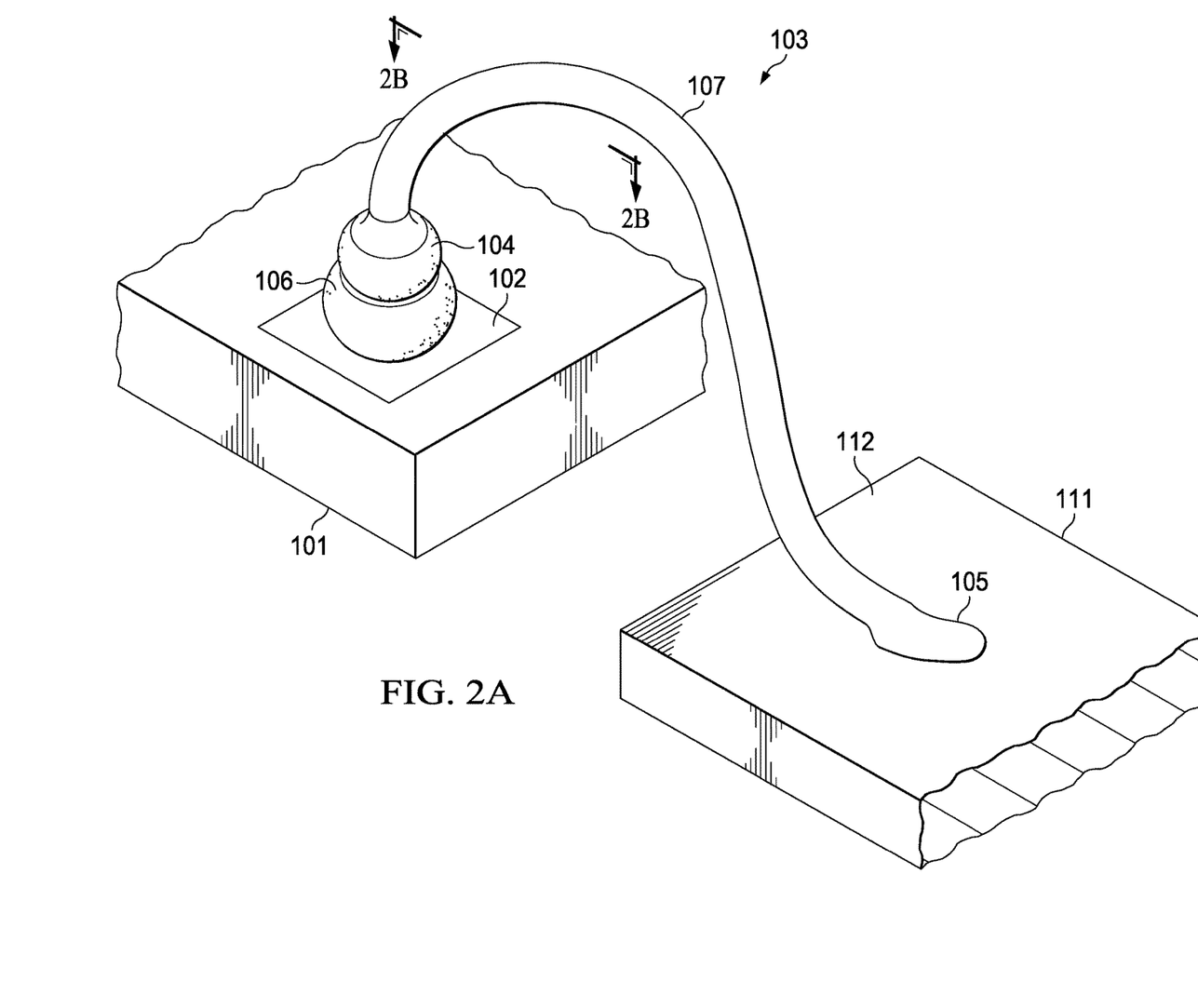
FIGS. 2A and 2B illustrate a portion of the semiconductor package of FIG. 1 including a bond pad of a semiconductor die with a gold bump and a copper wire bond extending from the gold bump.
Figure 2B:
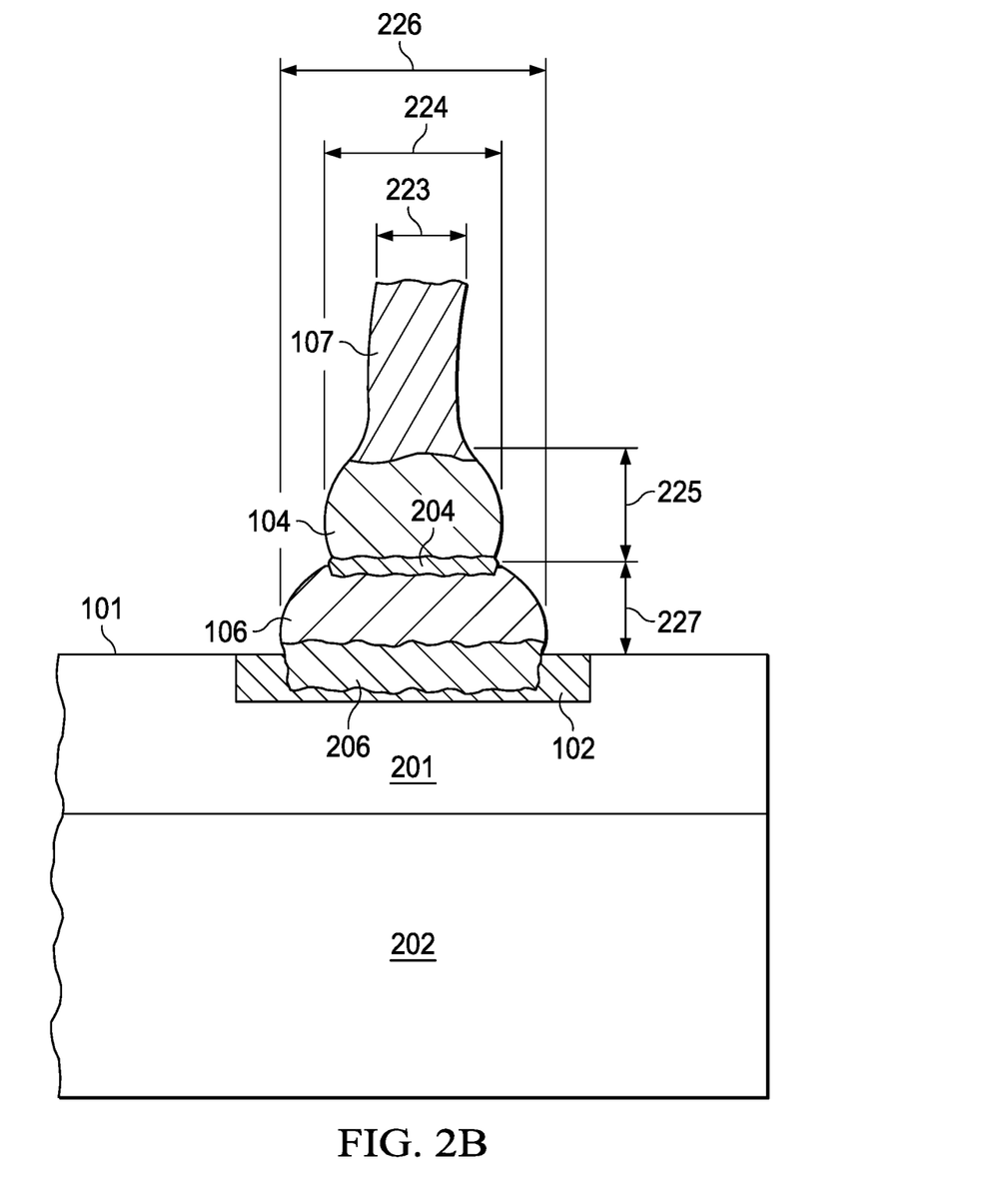

In specific examples, bond pads 102 of semiconductor die 101 may be aluminum bond pads over a dielectric layer of semiconductor die 101, such as protective overcoat 201 (FIG. 2B). Bond pads 102 are susceptible to damage during wire bonding due to mechanical loading and ultrasonic stresses applied by a tip of a bonding capillary. The damage may appear as microcracks, which may progress to fatal fractures in the underlying dielectric, as chip-outs of brittle or mechanically weak dielectric films, often together with pieces of metal or silicon, or as lifted ball bonds or delamination of metal layers.

Gold bump 106 may be applied with a lower bond energy than ball bond 104 of copper wire bond 103. During the higher-energy application of ball bond 104, gold bump 106 protects bond pad 102, mitigating damage to bond pad 102 and underlying dielectric layers and functional circuity from the attachment of ball bond 104.

Semiconductor die 101 may include any combination of semiconductor elements such as transistors and integrated circuits. In various examples of this disclosure, semiconductor die 101 may be implemented using any semiconductor material employed in industry, such as a silicon, gallium arsenide, gallium nitride, silicon germanium, or other semiconductor material. In addition, the techniques of this disclosure may be applied to semiconductor packages with any combination of active and passive components on a leadframe in addition to semiconductor die 101.

Leadframe 108 includes pad 110 and leads 111 spaced from pad 110 by a gap. Pad 110 is a substrate providing a stable support for firmly positioning semiconductor die 101 within semiconductor package 100. Leads 111 are shaped as cantilevered leads; in other examples, the leads may have other configurations, including but not limited to, the shape of flat leads as used in Quad Flat No-Lead (QFN) devices or in Small Outline No-Lead (SON) devices.

Leadframe 108 further includes pad straps 115 which extend between pad 110 to an external surface of semiconductor package 100. Pad straps 115 function to support pad 110 within a leadframe strip prior to molding of mold compound 130 and singulation of semiconductor package 100 from an array of semiconductor packages manufactured on a common leadframe strip.

Leadframes, such as leadframe 108, are formed on a single sheet of metal by stamping or etching. Multiple interconnected leadframes may be formed from a single sheet of substrate, the interconnected leadframes referred to as a leadframe strip. Leadframes on the sheet can be arranged in rows and columns. Tie bars, such as pad straps 115, interconnect leads and other elements of a leadframe to one another as well as to elements of adjacent leadframes in a leadframe strip. A siderail may surround the array of leadframes to provide rigidity and support leadframe elements on the perimeter of the leadframe strip. The siderail may also include alignment features to aid in manufacturing.

Usually die mounting, die to lead attachment, such as wire bonding, and molding to cover at least part of the leadframe and dies take place while the leadframes are still integrally connected as a leadframe strip. After such processes are completed, the leadframes, and sometimes mold compound of a package, are severed ("singulated" or "diced") with a cutting tool, such as a saw or laser. These singulation cuts separate the leadframe strip into separate semiconductor packages, each semiconductor package including a singulated leadframe, at least one die, electrical connections between the die and leadframe (such as gold or copper wire bonds) and the mold compound which covers at least part of these structures.

Tie bars and siderails may be removed during singulation of the packages formed with a single leadframe strip. The term leadframe of represents the portions of the leadframe strip remaining within a package after singulation. With respect to semiconductor package 100, leadframe 108 includes pad 110, two pad straps 115, and leads 111, although some of these elements are not interconnected following singulation of semiconductor package 100 into a discrete package.

Semiconductor die 101 is bonded on pad 110 with die attach adhesive 113. Adhesive 113 includes a plurality of components including a resin. The resin may include epoxy resins, polyurethane resins, and/or silicone resins. The resin may be filled or unfilled, and die attach adhesive 113 may further include one or more of the following: hardener, curing agent, fused silica, inorganic fillers, catalyst, flame retardants, stress modifiers, adhesion promoters, and other suitable components. Fillers, if any, may be selected to modify properties and characteristics of the resin base materials. Inert inorganic fillers may be selected to lower CTE, to more closely match semiconductor die 101 for example, increase thermal conductivity, increase elastic modulus of adhesive 113 compared to the resin base. Particulate fillers may be selected to reduce strength characteristics such as tensile strength and flexural strength compared to the resin base materials.

Semiconductor die 101, pad 110, gold bumps 106, and wire bonds 103 are covered by mold compound 130. End portions 112 of leads 111, which carry stitch bonds 105, are also covered by mold compound 130, while leads 111 extend to an exterior surface of the mold compound to facilitate electrical connections between package 100 and external components, such as board 120 (FIG. 1). Mold compound 130 provides a protective outer layer for semiconductor die 101 and wire bonds 103 formed in a molding process. In some examples, mold compound 130 includes an epoxy such as an epoxy-based thermoset polymer.

FIGS. 2A and 2B illustrate bond pad 102 of semiconductor die 101 with gold bump 106 and a copper wire 107 extending from gold bump 106 as part of wire bond 103. Specifically, FIG. 2A is a perspective view of the entirety of copper wire bond 103 with end portion 112 of a respective lead 111 with stitch bond 105. FIG. 2B is a schematic cross section of semiconductor die 101, gold bump 106, ball bond 104 and a portion of a copper wire 107 of copper wire bond 103 extending from gold bump 106.

The schematic cross section of FIG. 2B illustrates a portion of semiconductor die 101, which has a protective overcoat 201, such as silicon nitride or oxynitride over a semiconductor layer 202 including functional components of semiconductor die 101. An opening in overcoat 201 exposes a metallic bond pad 102.

Overcoat 201 may include mechanically weak dielectrics such as silicon-containing hydrogen silsesquioxane (HSQ), aerogels, organic polyimides, parlenes, or alternating layers of plasma-generated tetraethylorthosilicate (TEOS) oxide and HQS, or ozone TEOS oxide and HSQ. The mechanical weakness of these dielectrics, generally referred to as low-k dielectrics, is prone to suffer cracks by mechanical pressure and stress created during wire bonding operations, but their lower dielectric constant helps to reduce the capacitance C in the RC time constant of circuits and thus allows higher circuit speed.

Bond pad 102 is located over overcoat 201 and includes metallization to connect active and/or passive components of semiconductor die 101. In various examples, bond pad 102 may be aluminum or copper, or stacked layers thereof.

A flattened metal gold bump 106 is in contact with bond pad 102 inside a perimeter of the bond pad opening in overcoat 201. Gold bump 106 may be created from a free air ball at the end of a gold wire (not shown) by flattening the air ball against bond pad 102. The air ball has a typical diameter from about 1.2 to 1.6 times a diameter of the gold wire used to form gold bump 106. Whereas gold bump 106 is squished even flatter by way of attachment to bond pad 102 and subsequent attachment of ball bond 104 to gold bump 106 such that gold bump 106 diameter 226 may be more than twice the diameter of the gold wire used to form gold bump 106. An intermetallic layer 206 of gold and aluminum is between aluminum bond pad 102 and gold bump 106 such that gold bump 106 is conductively attached to bond pad 102 by intermetallic layer 206. In some examples, gold bump 106 is made of gold at least 99% pure, such at least 99.99% pure, such as at least 99.999% pure. At these high purity levels, gold is relatively soft, especially as a macro-crystalline structure (heat treated). In addition, these high purity levels of gold mitigate the formation of undesirable voids in intermetallic layer 206.

In examples where bond pad 102 is an aluminum bond pad, intermetallic layer 206 may include $Au_8Al_3$ and $Au_4Al$, and potentially $Au_5Al_2$ and/or $AuAl$. These intermetallic compounds may provide suitable mechanical and electrical properties suitable for intermetallic layer 206. In contrast, $Au_2Al$ and $Au_5Al_2$ (white plague) both provide low electrical conductivity, and $AuAl_2$ (purple plague) is relatively brittle; it is desirable to limit formation of these intermetallic compounds within intermetallic layer 206. $Au_2Al$, $Au_5Al_2$, and $AuAl_2$ predominantly form at relatively higher energy and temperatures than more desirable Au—Al intermetallic compounds. Accordingly, it is important to limit bonding energy and temperature during and after formation of gold bump 106 on bond pad 102, including during the formation of ball bond 104 on gold bump 106.

Copper wire 107 of wire bond 103 is connected to the gold bump 106 with ball bond 104. Wire 107 is a composed metal such as a copper or copper alloy and has typically a diameter 223 of about 10 to 25 µm. In some examples, copper wire 107 is made of copper at least 99% pure, such at least 99.99% pure, such as at least 99.999% pure. In this composition, wire 107 is harder than gold bump 106.

Ball bond 104 may be created from a free air ball at the end of wire 107, then flattening this air ball against gold bump 106 to provide a flattened diameter 224. The air ball has a typical diameter from about 1.2 to 1.6 times diameter 223 of wire 107. During attachment, ball bond 104 may further flatten gold bump 106 to provide a flattened diameter 226 due to the softness of gold bump 106 compared to copper. In some examples, flattened diameter 224 of ball bond 104 may be at least twice wire diameter 223, whereas flattened diameter 226 of gold bump 106 may be greater than flattened diameter 224 of ball bond 104, such as at least ten percent greater than flattened diameter 224 of ball bond 104. In addition, a height 225 of ball bond 104 may be greater than height 227 of gold bump 106. The relative heights 225, 227 and diameters 224, 226 of ball bond 104 and gold bump 106 reflect the manufacturing processes used in their formation, as described with respect to FIGS. 3A-3E and FIG. 4.

An intermetallic layer 204 of copper and gold is formed between gold bump 106 and ball bond 104, conductively and mechanically attaching gold bump 106 and ball bond 104. In some examples, intermetallic layer 204 includes $Cu_3Au$ adjacent to copper wire 107, $CuAu_3$ adjacent to gold bump 106, and CuAu between the $Cu_3Au$ and the $CuAu_3$. These intermetallic compounds provide suitable mechanical and electrical connections between gold bump 106 and ball bond 104.

A thickness of intermetallic layer 206 of gold and aluminum may be larger than a thickness of thickness of intermetallic layer 204 of copper and gold. For example, intermetallic layer 206 may form faster than intermetallic layer 204. In some of such examples, a thickness of intermetallic layer 206 of gold and aluminum may be no greater than 4 micrometers (μm). In some examples, the aluminum of bond pad 102 may be largely absorbed by intermetallic layer 206 beneath gold bump 106, thereby limiting a thickness of intermetallic layer 206. In the same or different examples, a thickness of intermetallic layer 204 of copper and gold is no greater than 1 μm.

A wire bonding or gold bump formation process may begin with positioning semiconductor die 101 on a heated pedestal to raise the temperature to between 150 and 300° C. For copper and aluminum wires, ball formation and bonding may be performed in a reducing atmosphere such as dry nitrogen gas with a few percent hydrogen gas. Such a reducing atmosphere is generally not required for gold wires, or to form gold bumps 106.

With both the wire bonding process and gold bump formation, the wire is strung through the capillary of an automated bonder. A capillary is an elongated tube of an inert material such as a ceramic with a fine bore (the capillary in the strict sense) suitable for guiding a metal wire used to form the gold bumps or wire bonds. At the wire end extruding from the capillary tip, a free air ball may be created by melting the wire end using either a flame or a spark technique. The capillary is moved towards an attachment area of one of bond pads 102 in the case of gold bumps 106, or towards an attachment area of one of gold bumps 106 in the case of ball bonds 104.

A free air ball of melted wire is pressed against the metallization of the attachment area by a compression force, often combined with ultrasonic movement of the ball relative to the attachment area, transmitting ultrasonic energy, in order to attach a gold bump 106 or a ball bond 104 to the underlying metal.

The bonding process results in a metal nail head or squashed ball, as shown with respect to gold bumps 106. In a specific example of gold bump 106, the attachment process of squashing free air balls against the metal, such as aluminum, of bond pads 102 creates intermetallic layer 206 of Au—Al intermetallic compounds. In a specific example of ball bond 104, the attachment process of squashing free air balls against the gold bumps 106 creates intermetallic layer 204 of Cu—Au intermetallic compounds.

After the ball attachment, the capillary with wire 107 may be lifted in a controlled loop to span an arch from the ball bond, such as ball bond 104, to an attachment area on a substrate or a leadframe, such as a lead stitch area of an end portion 112 of one of leads 111. When the wire touches the attachment area surface, the capillary tip is pressed against the wire in order to flatten it and thus to form a stitch bond, such as stitch bond 105, sometimes referred to as a wedge bond.

For substrate-based attachment areas, the bonding temperature may be about 160° C.; whereas for leadframe-based attachment areas, the bonding temperature may be between 240 and 260° C. The bonding force may be in the range from about 50 to 150 grams, and the ultrasonic energy may be in the range from about 80 to 180 milliamps. The stitch bond attachment process forms metal interdiffusions or welds.

The capillary rises again to a height sufficient to display a length of wire with enough metal to form the next ball. Then, a tear method is initiated to break the wire near the end of the stitch bond and leave the exposed wire length dangling from the capillary tip ready for the next ball-forming melting step. Various wire-breaking methods are commonly employed, such as a clamp-tear method and a table-tear method.

FIGS. 3A-3E illustrate conceptual process steps for manufacturing semiconductor package 100. FIG. 4 is a flowchart of a method of fabricating a semiconductor package including gold bumps on bond pads of a semiconductor die and copper wire bonds extending from the gold bumps, such as such as semiconductor package 100. For clarity, the method of FIG. 4 is described with reference to semiconductor package 100 and FIGS. 3A-3E; however, the described techniques may be adapted to other package designs and are not limited to the specific example of semiconductor package 100.

First, the shape of a leadframe strip including leadframe 108 as one of a plurality of interconnected leadframes, is patterned in a base metal, such as a copper sheet. In various examples, manufacturing leadframe strip may include stamping or photo etching a planar base metal to form the shape of leadframe strip. Leadframe strip includes multiple interconnected leadframes 108 with pads 110 and leads 111, as well the elements to interconnect adjacent leadframes, such as pad straps 115 and optional siderails.

Figure 3A:
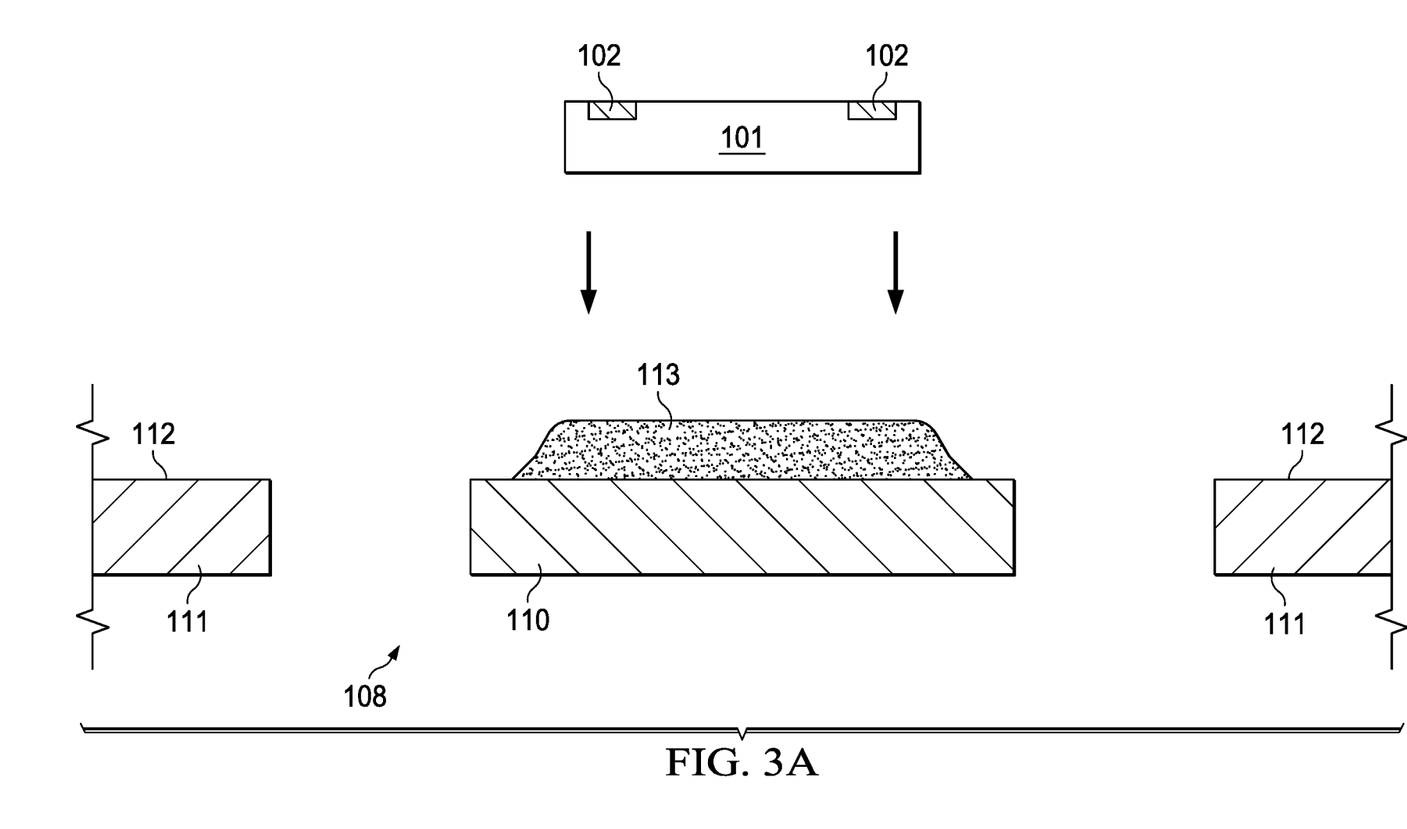
FIGS. 3A-3E illustrate conceptual process steps for manufacturing a semiconductor package including gold bumps on bond pads of a semiconductor die and copper wire bonds extending from the gold bumps, such as the semiconductor package of FIGS. 1, 2A and 2B.
Figure 4:
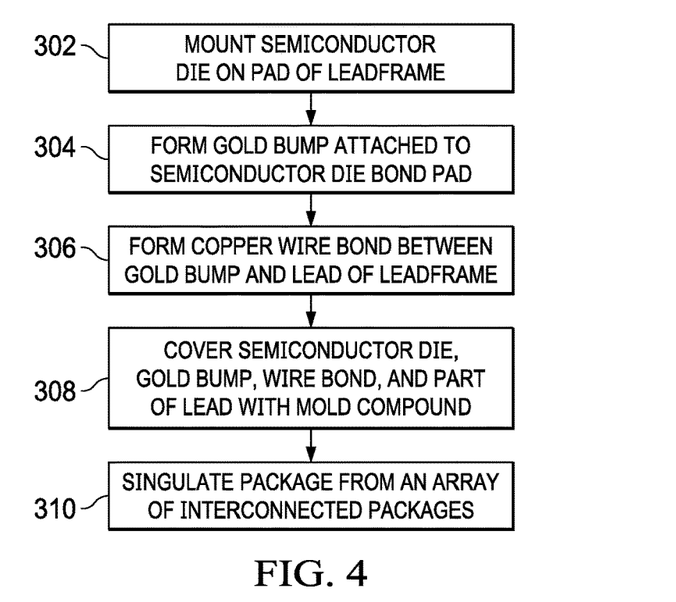
FIG. 4 is a flowchart of a method of fabricating a semiconductor package including gold bumps on bond pads of a semiconductor die and copper wire bonds extending from the gold bumps, such as the semiconductor package of FIGS. 1, 2A and 2B.

As shown in FIG. 3A, adhesive 113 is applied to pad 110 of leadframe 108. Die attach adhesive 113 may represent a thermal interface material, such as a conductive or nonconductive thermal paste. Such examples may facilitate heat dissipation from semiconductor die 101 through pad 110.

Figure 3B:
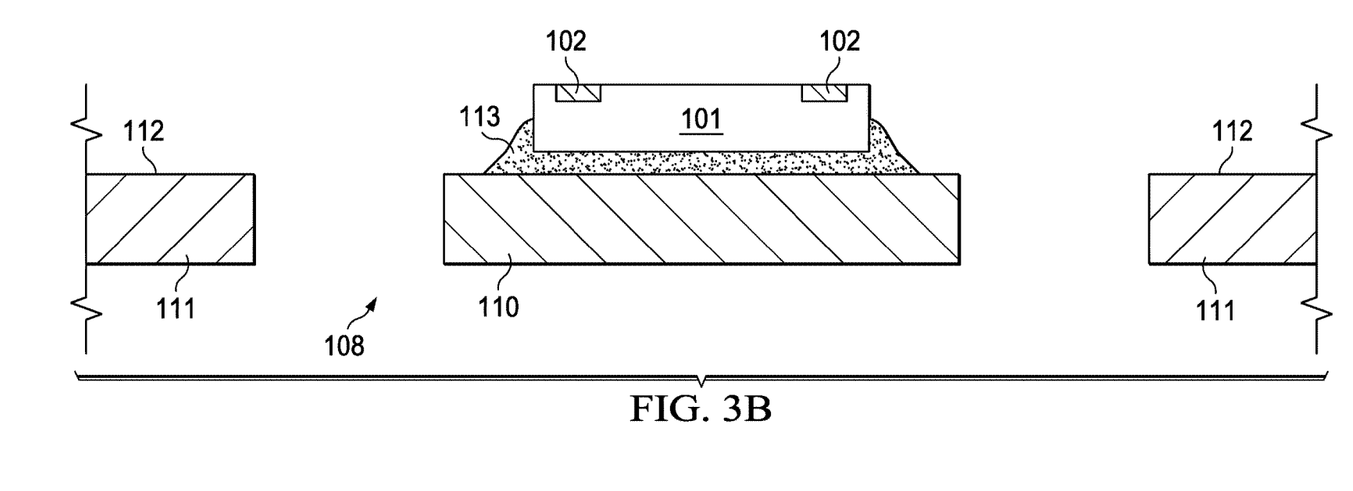

As shown in FIG. 3B, semiconductor die 101 is placed in contact with adhesive 113 on pad 110, and adhesive 113 is cured to bond semiconductor die 101 to pad 110 (FIG. 4, step 302). Curing adhesive 113 may include holding the assembly of leadframe 108 and semiconductor die 101 at a prescribed temperature for a prescribed period of time.

Figure 3C:
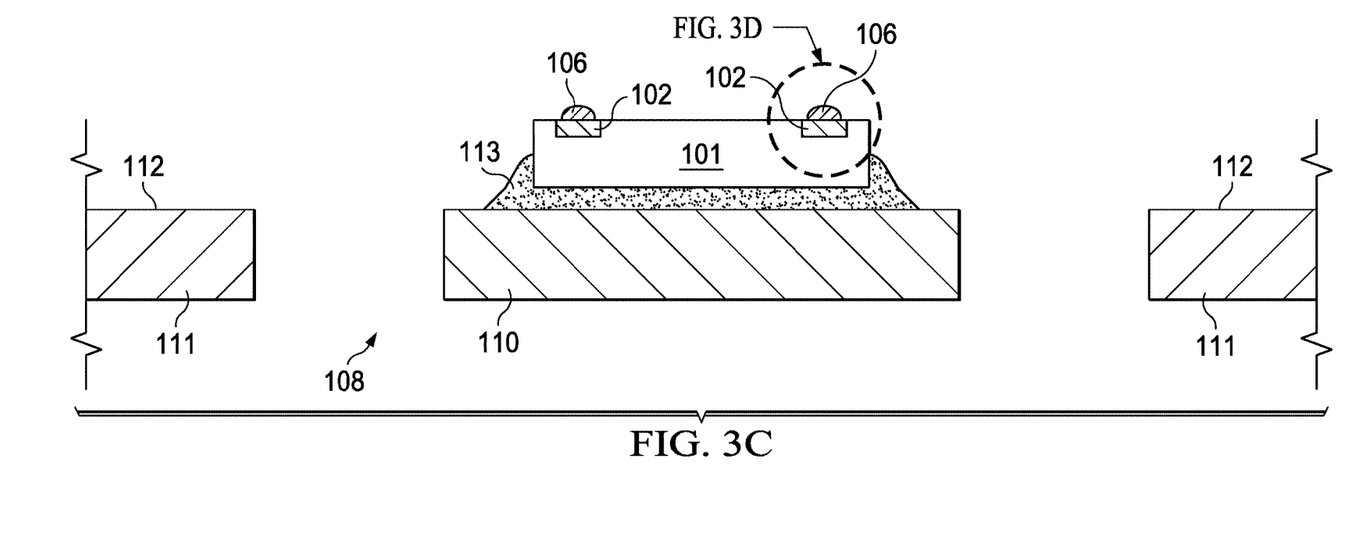

As shown in FIG. 3C, gold bumps 106 are formed on bond pads 102 of semiconductor die 101 (FIG. 4, step 304). Gold bumps 106 may be formed with a wire using a capillary of a metal wire bonder. For example, forming gold bumps 106 may include forming a free air ball from a gold wire, squashing the ball onto bond pad 102 to form a gold bump 106, and breaking the wire. The capillary may repeat the process for each of gold bumps 106.

Figure 3D:
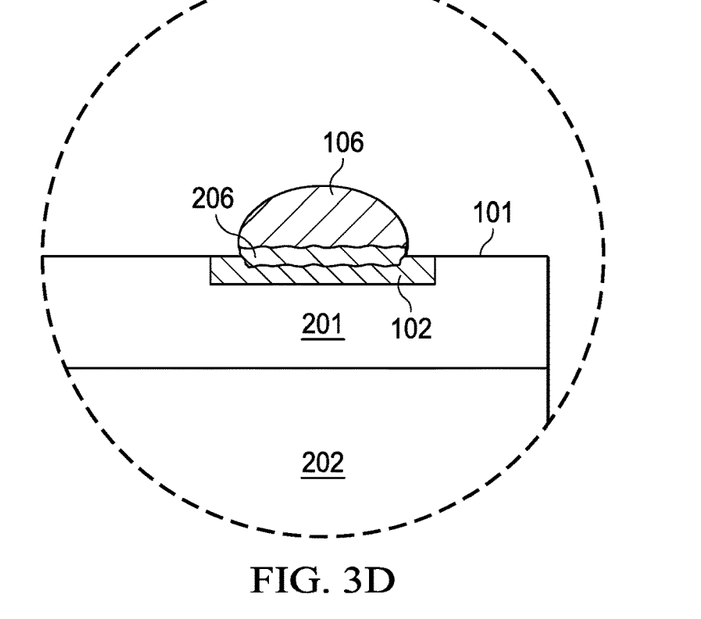

FIG. 3D is a close-up view of a portion of the assembly shown in FIG. 3C. FIG. 3D is in the same perspective as FIG. 2B. As shown in FIG. 3D, intermetallic layer 206 of gold and aluminum is thinner than in the completed wire bond 103 of FIG. 2B. This is because intermetallic layer 206 continues to grow, consuming metal of bond pad 102 and metal of gold bump 106 during the attachment of ball bond 104 to gold bump 106. For example, with a copper ball bond 104, attachment of ball bond 104 to gold bump 106 includes a higher bonding temperature than attachment of gold bump 106 to bond pad 102.

Figure 3E:
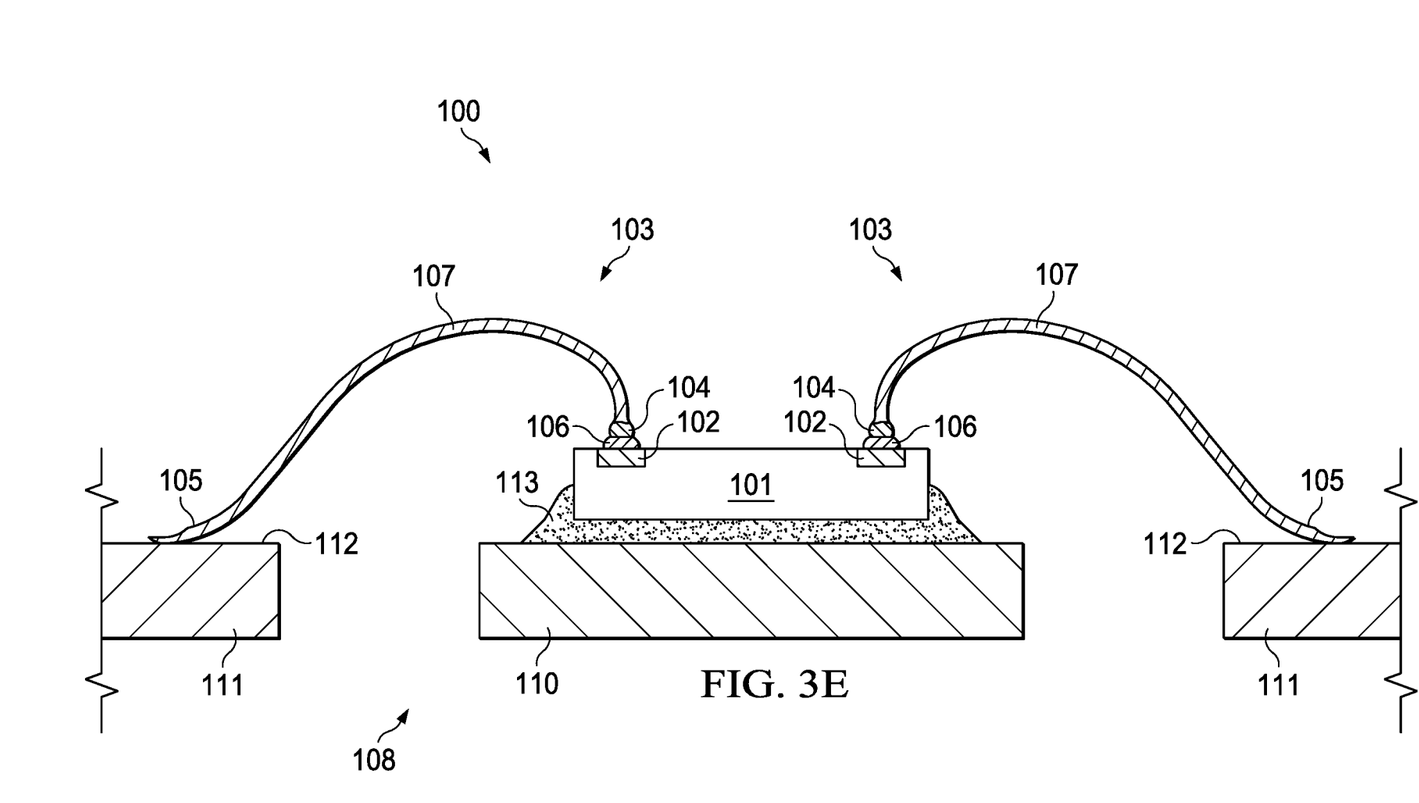

As shown in FIG. 3E, wire bonds 103 are formed between gold bumps 106 and end portions 112 of leads 111 (FIG. 4, step 306). Wire bonds 103 are formed from gold bumps 106 to adjacent leads 111 and with a wire using a capillary of a metal wire bonder. For example, forming wire bonds 103 may include forming a free air ball, squashing the ball onto gold bumps 106 to form a ball bond 104, spanning the wire to the corresponding lead 111 to form a wire 107, pressuring the wire to the lead to form stitch bond 105, and breaking the wire. The capillary may repeat the process for each of wire bonds 103. In general, because wire bonds 103 are formed from a different metal than gold bumps 106, separate capillaries are used to form gold bumps 106 and wire bonds 103.

Gold bump 106 may be applied with a lower bond energy than ball bonds 104 of copper wire bonds 103. During the higher-energy application of each copper wire bond 103, gold bump 106 protects bond pad 102, mitigating damage to bond pad 102 and underlying functional circuity of semiconductor die 101.

Bonding factors may be selected to provide gold bump 106 with a desired intermetallic layer 206 of gold and aluminum, and ball bond 104 with a desired intermetallic layer 204 of copper and gold. For example, because forming ball bond 104 with copper uses a greater temperature and a greater bond force than forming gold bump 106, further expansion of intermetallic layer 206 of gold and aluminum should be expected during the formation of ball bond 104 on gold bump 106. However, selected specific parameters may limit the growth of intermetallic layer 206 of gold and aluminum during the formation of ball bond 104. For example, an average thickness of intermetallic layer 206 may increase by no more than fifty percent during the formation of ball bond 104, or by no more than 25 percent, or even by no more than 10 percent.

Specific factors may be particularly suited to providing the intermetallic layer 206 of gold and aluminum with limited undesirable features, such as voids, or undesirable Au—Al intermetallic compounds which form at higher temperatures. For example, the bond time for forming ball bond 104 may be less than the bond time for forming gold bump 106. In addition, ultrasonic current for forming ball bond 104 may be less than ultrasonic current for forming gold bump 106. In some examples, attaching the free air ball to gold bump 106 to form ball bond 104 may occur in the absence of ultrasound current. Forming ball bond 104 with limited or no ultrasound current may reduce growth of intermetallics between bond pad 102 and gold bump 106 while forming ball bond 104 compared to alternative techniques utilizing higher levels of ultrasound current.

In specific examples, attaching, with a first capillary, a first free air ball to an aluminum bond pad 102 of a semiconductor die 101 to form a gold bump 106 may utilize a bond force within a range of 20 to 40 grams (g), such as 25 to 35 g, such as about 30 g, with a first ultrasound current range of 50 to 70 milliamps (mA), such as 55 to 65 mA, such as about 60 mA, applied during a first bond time of between 15 and 30 milliseconds (mS), such as 20 to 30 mS, such as about 24.3 mS, at a first temperature range of 160 to 200 degrees Celsius (° C.), such as 170 to 190° C., such as about 180° C. In the same or different examples, attaching, with a second capillary, a second free air ball to gold bump 106 to form a ball bond 104 may utilize a second bond force within a range of 60 to 100 g, such as 70 to 90 g, such as about 80 g, with a second ultrasound current range of 0 to 10 mA, such as 0 to 5 mA, such as about 0 mA, applied during a second bond time of between 8 and 15 mS, such as 10 to 15 mS, such as about 12 mS, at a second temperature range of 225 to 275° C., such as 240 to 260° C., such as about 250° C. As used herein, the term "about" means within the range of manufacturing tolerances associated with the value being described. These specific examples may be particularly suited for a given application; however, different applications of the techniques described herein may utilize different values.

Following the formation of wire bonds 103, and gold bumps 106, the assembly of leadframe 108, semiconductor die 101, adhesive 113, gold bumps 106, and wire bonds 103 is covered in mold compound 130 (FIG. 4, step 308). Mold compound 130 is molded around the assembled semiconductor die 101 and leadframe 108 portions. In this process, leadframe 108, with the attached and bonded semiconductor die 101, is placed in the cavity of a mold, such as a steel mold. A heated and viscous mold compound, such as an epoxy resin filled with inorganic granules, is pressured into the cavity to fill the cavity and surround semiconductor die 101 and leadframe 108 portions without voids. Mold compound 130 covers pad 110 and at least portions of leads 111, such as lead end portions 112. After polymerizing the mold compound and cooling to ambient temperature, the mold is opened, while mold compound 130 remains adhered to the molded parts. As leadframe 108 is part of leadframe strip, all the leadframe and die assemblies of the leadframe strip may be molded in unison. Individual semiconductor packages remain interconnected as part of leadframe strip after being covered with mold compound 130.

Following molding of mold compound 130, semiconductor package 100 is singulated from the array of interconnected packages manufactured on the leadframe strip (FIG. 4, step 310). For example, singulation may include cutting through leadframe strip to separate semiconductor package 100 from a plurality of semiconductor packages 100 manufactured on leadframe strip. Portions of leadframe strip may be discarded following singulation. Following singulation, leads 111 may be bent into their final positions, if needed.

The specific techniques for semiconductor packages including gold bumps on bond pads of a semiconductor die and copper wire bonds extending from the gold bumps, such as semiconductor package 100, are merely illustrative of the general inventive concepts included in this disclosure as defined by the following claims. As an example, this disclosure applies not only to semiconductor packages with wire bond connections to a leadframe, but also to other wire bond connections, such as wire bonds from a semiconductor die bond pad to a conductive pad of a different substrate, such as an organic substrate, and wire bonds directly connecting bond pads of multiple semiconductor dies within a package to each other.

What is claimed is:

1. A method for fabricating a semiconductor package comprising:

forming a first free air ball of a gold wire at a first tip of a first capillary;

attaching, with the first capillary, the first free air ball to a metallic bond pad of a semiconductor die to form a gold bump attached to the metallic bond pad with a first bond force with a first ultrasound current applied during a first bond time at a first temperature, the metallic bond pad being over a dielectric layer of the semiconductor die;

separating the first ball from the gold wire;

forming a second free air ball of a copper wire at a second tip of a second capillary;

attaching, with the second capillary, the second free air ball to the gold bump with a second bond force applied during a second bond time at a second temperature to form a ball bond, wherein the second temperature is greater than the first temperature, wherein the second bond force is greater than the first bond force, and
wherein the second bond time is less than the first bond time;
spanning the copper wire in a controlled loop to a conductive pad;
pressuring the copper wire to form a stitch bond between the copper wire and the conductive pad; and
breaking the copper wire.

2. The method of claim 1, wherein attaching the second free air ball to the gold bump occurs with a second ultrasound current, the second ultrasound current being less than the first ultrasound current.

3. The method of claim 1, wherein attaching the second free air ball to the gold bump occurs in absence of ultrasound current.

4. The method of claim 1, wherein the metallic bond pad of the semiconductor die is formed from aluminum.

5. The method of claim 4,
wherein attaching the first free air ball to the metallic bond pad creates an intermetallic layer of gold and aluminum, and
wherein attaching the second free air ball to the gold bump increases a thickness of the intermetallic layer by no more than fifty percent.

6. The method of claim 5, wherein, following the attachment of the second free air ball to the gold bump, the thickness of the intermetallic layer is no greater than 4 micrometers (μm).

7. The method of claim 5,
wherein the intermetallic layer is a first intermetallic layer,
wherein attaching the second free air ball to the gold bump creates a second intermetallic layer of copper and gold, and
wherein, following the attachment of the second free air ball to the gold bump, a thickness of the second intermetallic layer is no greater than 1 micrometers (μm).

8. The method of claim 7, wherein the intermetallic layer includes $Cu_3Au$ adjacent to the copper wire, $CuAu_3$ adjacent to the gold bump, and $CuAu$ between the $Cu_3Au$ and the $CuAu_3$.

9. The method of claim 1,
wherein the gold wire is of at least 99% purity, and
wherein the copper wire is of at least 99% purity.

10. The method of claim 1, further comprising covering the semiconductor die, the metallic bond pad, the gold bump, the ball bond, the copper wire, the stitch bond and the conductive pad with mold compound.

11. A method for fabricating a semiconductor package comprising:
forming a first free air ball of a gold wire at a first tip of a first capillary;
attaching, with the first capillary, the first free air ball to an aluminum bond pad of a semiconductor die to form a gold bump attached to the aluminum bond pad with a first bond force within a range of 20 to 40 grams (g) with a first ultrasound current range of 50 to 70 milliamps (mA) applied during a first bond time of between 15 and 30 milliseconds (mS) at a first temperature range of 160 to 200 degrees Celsius (° C.), the aluminum bond pad being over a dielectric layer of the semiconductor die;
separating the gold bump from the gold wire;
forming a second free air ball of a copper wire at a second tip of a second capillary;
attaching, with the second capillary, the second free air ball to the gold bump to form a ball bond with a second bond force within a range of 60 to 100 g with a second ultrasound current range of 0 to 10 mA applied during a second bond time of between 8 and 15 mS at a second temperature range of 225 to 275° C.;
spanning the copper wire in a controlled loop to a conductive pad;
pressuring the copper wire to form a stitch bond between the copper wire and the conductive pad; and
breaking the copper wire.

12. The method of claim 11,
wherein the range of the first bond force is 25 to 35 g,
wherein the first ultrasound current range is 55 to 65 mA,
wherein the first bond time of is between 20 and 30 mS,
wherein the first temperature range is 170 to 190° C.,
wherein the range of the second bond force is 70 to 90 g,
wherein the second ultrasound current range is 0 to 5 mA,
wherein the second bond time of is between 10 and 15 mS, and
wherein the second temperature range is 240 to 260° C.

13. The method of claim 11, further comprising covering the semiconductor die, the aluminum bond pad, the gold bump, the ball bond, the copper wire, the stitch bond and the conductive pad with mold compound.

14. A method for fabricating a semiconductor package comprising:
forming a first free air ball of a gold wire at a first tip of a first capillary;
attaching, with the first capillary, the first free air ball to a metallic bond pad of a semiconductor die to form a gold bump attached to the metallic bond pad with a first bond force with a first ultrasound current applied during a first bond time at a first temperature, the metallic bond pad being over a dielectric layer of the semiconductor die;
separating the first ball from the gold wire;
forming a second free air ball of a copper wire at a second tip of a second capillary;
attaching, with the second capillary, the second free air ball to the gold bump with a second bond force applied during a second bond time at a second temperature to form a ball bond; and
spanning the copper wire in a controlled loop to a conductive pad.

15. The method of claim 14, wherein the metallic bond pad of the semiconductor die is formed from aluminum.

16. The method of claim 15,
wherein attaching the gold wire to the metallic bond pad creates an intermetallic layer of gold and aluminum, and
wherein attaching the copper wire to the gold bump increases a thickness of the intermetallic layer by no more than fifty percent.

17. The method of claim 16, wherein, following the attachment of the copper wire to the gold bump, the thickness of the intermetallic layer is no greater than 4 micrometers (μm).

18. The method of claim 16,
wherein the intermetallic layer is a first intermetallic layer,
wherein attaching the copper wire to the gold bump creates a second intermetallic layer of copper and gold, and
wherein, following the attachment of the copper wire to the gold bump, a thickness of the second intermetallic layer is no greater than 1 micrometers (μm).

19. The method of claim 18, wherein the intermetallic layer includes $Cu_3Au$ adjacent to the copper wire, $CuAu_3$ adjacent to the gold bump, and $CuAu$ between the $Cu_3Au$ and the $CuAu_3$.

20. The method of claim 14,
wherein the gold wire is of at least 99% purity, and
wherein the copper wire is of at least 99% purity.

21. The method of claim 14, further comprising covering the semiconductor die, the metallic bond pad, the gold bump, the ball bond, the copper wire, the stitch bond and the conductive pad with mold compound.

22. A method for fabricating a semiconductor package comprising:
attaching a gold wire to a metallic bond pad of a semiconductor die to form a gold bump attached to the metallic bond pad, the metallic bond pad being over a dielectric layer of the semiconductor die;
attaching a copper wire to the gold bump; and
spanning the copper wire in a controlled loop to a conductive pad.

23. The method of claim 22, wherein the metallic bond pad of the semiconductor die is formed from aluminum.

24. The method of claim 23,
wherein attaching the gold wire to the metallic bond pad creates an intermetallic layer of gold and aluminum, and
wherein attaching the copper wire to the gold bump increases a thickness of the intermetallic layer by no more than fifty percent.

25. The method of claim 24, wherein, following the attachment of the copper wire to the gold bump, the thickness of the intermetallic layer is no greater than 4 micrometers (μm).

26. The method of claim 24,
wherein the intermetallic layer is a first intermetallic layer,
wherein attaching the copper wire to the gold bump creates a second intermetallic layer of copper and gold, and
wherein, following the attachment of the copper wire to the gold bump, a thickness of the second intermetallic layer is no greater than 1 micrometers (μm).

27. The method of claim 26, wherein the intermetallic layer includes $Cu_3Au$ adjacent to the copper wire, $CuAu_3$ adjacent to the gold bump, and $CuAu$ between the $Cu_3Au$ and the $CuAu_3$.

28. The method of claim 22, wherein the gold wire is of at least 99% purity, and wherein the copper wire is of at least 99% purity.

29. The method of claim 22, further comprising covering the semiconductor die, the metallic bond pad, the gold bump, the ball bond, the copper wire, the stitch bond and the conductive pad with mold compound.

* * * * *